(12) United States Patent
Haag et al.

(10) Patent No.: US 6,750,624 B2
(45) Date of Patent: Jun. 15, 2004

(54) NON-CONTACT OBSTACLE DETECTION SYSTEM UTILIZING ULTRA SENSITIVE CAPACITIVE SENSING

(75) Inventors: Ronald Helmut Haag, Clarkston, MI (US); Brian Deplae, Warren, MI (US); Jeremy M. Husic, Washington, MI (US); John Pasiecznik, Jr., Malibu, CA (US)

(73) Assignee: Delphi Technologies, Inc., Troy, MI (US)

(*) Notice: Subject to any disclaimer, the term of this patent is extended or adjusted under 35 U.S.C. 154(b) by 40 days.

(21) Appl. No.: 10/143,141

(22) Filed: May 10, 2002

(65) Prior Publication Data

US 2003/0071727 A1 Apr. 17, 2003

Related U.S. Application Data

(60) Provisional application No. 60/330,171, filed on Oct. 17, 2001, provisional application No. 60/330,173, filed on Oct. 17, 2001, and provisional application No. 60/361,803, filed on Mar. 5, 2002.

(51) Int. Cl.$^7$ .................................................. H02P 7/00
(52) U.S. Cl. ..................... 318/467; 318/466; 318/468; 318/266; 49/26; 49/28; 361/301.1
(58) Field of Search ................................ 318/445, 468, 318/466, 265, 266; 49/26, 28

(56) References Cited

U.S. PATENT DOCUMENTS

| | | | |
|---|---|---|---|
| 4,305,007 A | 12/1981 | Hughes | 307/116 |
| 4,327,323 A | 4/1982 | Walker | 324/61 |
| 4,351,016 A | 9/1982 | Felbinger | 361/181 |
| 4,410,843 A | 10/1983 | Sauer et al. | 318/317 |
| 4,453,112 A | 6/1984 | Sauer et al. | 318/281 |
| 5,027,552 A | 7/1991 | Miller et al. | 49/27 |
| 5,089,672 A | 2/1992 | Miller | 200/61.43 |
| 5,287,086 A | 2/1994 | Gibb | 340/618 |
| 5,296,658 A | 3/1994 | Kramer et al. | 200/61.43 |

(List continued on next page.)

FOREIGN PATENT DOCUMENTS

| | | |
|---|---|---|
| DE | 2538531 A | 3/1977 |
| DE | 25 38 531 A | 3/1977 |
| DE | 19836056 | 2/2000 |
| GB | 2243217 A | 10/1991 |
| GB | 2 243 217 A | 10/1991 |
| GB | 2366385 A | 3/2002 |
| GB | 2 366 385 A | 3/2002 |

OTHER PUBLICATIONS

U.S. patent application Ser. No. 10/142,641, filed May 10, 2002 and entitled Method and Apparatus for Detecting a Change in Capacitance of a Capacitive Proximity Sensor, attorney docket No. DP–306074.

(List continued on next page.)

*Primary Examiner*—Rita Leykin
(74) *Attorney, Agent, or Firm*—Scott A. McBain

(57) ABSTRACT

A non-contact obstacle detection system utilizing ultra sensitive capacitive techniques. In an exemplary embodiment, the system includes a sensing element disposed in proximity to a moveable panel and a proximity detection circuit in communication with the sensing element. The proximity detection circuit generates a differential output signal reflective of whether a foreign object is in proximity to the sensing element. In addition, a central control module is in communication with the sensing element. The central control module determines whether the differential output signal is reflective of a foreign object in proximity to the sensing element. If the central control module determines that the differential output signal is reflective of a foreign object in proximity to the sensing element, and the moveable panel is moving toward a closed position, then the central control module generates a control output signal to stop the moveable panel from moving toward the closed position.

30 Claims, 6 Drawing Sheets

U.S. PATENT DOCUMENTS

| | | | |
|---|---|---|---|
| 5,327,680 A | | 7/1994 | Miller .......................... 49/27 |
| 5,394,292 A | * | 2/1995 | Hayashida ................. 361/179 |
| 5,428,923 A | * | 7/1995 | Waggamon .................... 49/28 |
| 5,463,378 A | | 10/1995 | Gibb .......................... 340/618 |
| 5,473,461 A | * | 12/1995 | Miremadi .................. 398/202 |
| 5,484,477 A | * | 1/1996 | George et al. .............. 106/499 |
| 5,651,044 A | | 7/1997 | Klotz, Jr. et al. ........... 378/117 |
| 5,790,107 A | | 8/1998 | Kasser et al. ............... 345/174 |
| 5,801,340 A | | 9/1998 | Peter .......................... 178/19 |
| 5,832,772 A | | 11/1998 | McEwan ..................... 73/290 |
| 6,006,386 A | | 12/1999 | Mohaupt .................. 7/862.68 |
| 6,025,782 A | | 2/2000 | Newham ................. 340/573.1 |
| 6,078,014 A | | 6/2000 | Kashiwazaki et al. ... 200/61.43 |
| 6,150,932 A | | 11/2000 | Kenue |
| 6,158,170 A | | 12/2000 | Brodowsky ..................... 49/28 |
| 6,166,381 A | | 12/2000 | Augeri et al. ............... 250/332 |
| 6,229,408 B1 | * | 5/2001 | Jovanovich et al. ........ 333/167 |
| 6,263,199 B1 | | 7/2001 | Wortel et al. ............... 455/333 |
| 6,275,048 B1 | | 8/2001 | Milli ......................... 324/690 |
| 6,282,413 B1 | | 8/2001 | Baltus ........................ 455/260 |
| 6,288,640 B1 | | 9/2001 | Gagnon ...................... 340/539 |
| 6,297,605 B1 | | 10/2001 | Butler et al. ................ 318/466 |
| 6,321,071 B1 | | 11/2001 | Pekkarinen et al. ........ 455/115 |
| 6,329,779 B1 | | 12/2001 | Pimley et al. |
| 6,348,862 B1 | * | 2/2002 | McDonnell et al. ........ 340/562 |
| 6,377,009 B1 | * | 4/2002 | Philipp ....................... 318/468 |
| 6,429,782 B2 | | 8/2002 | Pavatich et al. ............ 340/686 |
| 6,455,839 B1 | * | 9/2002 | O'Connor et al. .......... 250/221 |
| 6,499,359 B1 | | 12/2002 | Washeleski et al. ... 73/862.473 |
| 6,600,284 B1 | | 7/2003 | Weber et al. ............... 318/466 |
| 2001/0011894 A1 | | 8/2001 | Havey et al. ............... 324/662 |

OTHER PUBLICATIONS

U.S. patent application Ser. No. 10/142,643, filed May 10, 2002 and entitled Flexible Capacitive Strip for use in a Non–Contact Obstacle Detection System, attorney docket No. DP–304424.

U.S. patent application Ser. No. 10/142,680, filed May 10, 2002 and entitled Capacitive Sensor Assembly for Use in a Non–Contact Obstacle Detection System, attorney docket No. DP–307244.

Synergy® Microwave Corporation, Mixers, pp. 43–56.

International Search Report for PCT/US02/32584, Dec. 9, 2002, 1 page.

European Search Report for EP 1343252A3, Sep. 22, 2003, 2 pages.

* cited by examiner

NON-CONTACT OBSTACLE DETECTION SYSTEM UTILIZING ULTRA SENSITIVE CAPACITIVE SENSING

CROSS REFERENCE TO RELATED APPLICATIONS

This application claims the benefit of U.S. provisional application No. 60/330,171, filed Oct. 17, 2001, the contents of which are incorporated by reference herein in their entirety.

This application further claims the benefit of U.S. provisional application No. 60/330,173, filed Oct. 17, 2001, the contents of which are incorporated by reference herein in their entirety.

This application further claims the benefit of U.S. provisional application No. 60/361,803, filed Mar. 5, 2002, the contents of which are incorporated by reference herein in their entirety.

BACKGROUND

The present disclosure relates generally to proximity detecting systems and, more particularly, to a non-contact obstacle detection system (for example, a human obstacle) or other objects having similar dielectric properties utilizing ultra sensitive capacitive sensing, such as may be implemented in conjunction with a motor vehicle power lift-gate.

Various systems have been devised for detecting obstacles (e.g., humans) in the path of a moveable panel such as an automotive power window, power sliding door or power hinged door. When an obstacle is detected, forward movement (e.g., closing) of the panel is interrupted and, optionally, the movement of the panel may be thereafter reversed (e.g., opened). These detection systems may generally be characterized as either "contacting" or "non-contacting". In a contacting system, an obstacle is detected only after some form of physical contact occurs between the panel and the obstacle, and may include devices such as pneumatic/pressure sensitive strips, or possibly sensors responsive to changes in mechanical or electrical loading in the apparatus that moves the panel.

On the other hand, in a non-contacting system, an obstacle is detected before actual contact occurs. One specific type of non-contacting obstacle detection system employs the use of a capacitive element(s) as a proximity sensor(s). Capacitive proximity sensors may include one or more electrical conductors formed along the leading edge of a moveable panel, as well as a capacitance sensitive circuit (e.g., a bridge circuit or an oscillator) coupled to the conductor(s). An obstacle (e.g., a human hand) in proximity to the conductor (s) changes the capacitance of the sensor, which change is thereafter detected by the capacitive sensitive circuit.

Unfortunately, certain difficulties are inherent in creating a sensitive capacitive proximity system that can distinguish between environmental conditions and an actual foreign object. On one hand, the sensors themselves may not be of uniform design and/or sensitivity, or may be subjected to certain environmental conditions (e.g., moisture) that can affect the capacitance value thereof. In addition, certain high frequency components in such capacitance detection systems can result in radiated emissions to neighboring electronic components.

SUMMARY

The above discussed and other drawbacks and deficiencies of the prior art are overcome or alleviated by a non-contact obstacle detection system utilizing ultra sensitive capacitive techniques. In an exemplary embodiment, the system includes a sensing element disposed in proximity to a moveable panel and a proximity detection circuit in communication with the sensing element. The proximity detection circuit generates a differential output signal reflective of whether a foreign object is in proximity to the sensing element. In addition, a central control module is in communication with the sensing element. The central control module determines whether the differential output signal is reflective of a foreign object in proximity to the sensing element. If the central control module determines that the differential output signal is reflective of a foreign object in proximity to the sensing element, and the moveable panel is moving toward a closed position, then the central control module generates a control output signal to stop the moveable panel from moving toward the closed position.

In a preferred embodiment, the sensing element further includes a capacitive sensing element having a nominal capacitance, wherein the proximity detection circuit detects a change in the nominal capacitance as a result of a foreign object in proximity to the sensing element. The proximity detection circuit is integrated within the sensing element, and further includes a first oscillator, which generates a first frequency signal. The first frequency signal is dependent upon the capacitance of the sensing element. A second oscillator generates a reference frequency signal, wherein the differential output signal is determined from a comparison between the first frequency signal and the reference frequency signal.

Preferably, the obstacle detection system further includes a coaxial cable coupling the proximity detection circuit and the central control module, the coaxial cable transmitting both a DC power signal and the differential output signal. Both the proximity detection circuit and the central control module further include a bias "T" apparatus included therewith.

BRIEF DESCRIPTION OF THE DRAWINGS

Referring to the exemplary drawings wherein like elements are numbered alike in the several Figures.

DETAILED DESCRIPTION

Disclosed herein is a non-contact obstacle detection system that utilizes ultra sensitive capacitance techniques to control the movement of an electrically powered system such as power lift-gates, power sliding doors, power deck lids, or a moving door of a vehicle. Generally speaking, the system is based on an ultra sensitive capacitive detection technique, in which a proximity detection circuit is integrated directly into a capacitive sensing element. The capacitive sensing element may be embodied, for example, by a capacitive strip flexibly mounted to a metal panel such as a motor vehicle pillar or a lift-gate. When a foreign object (e.g., a human hand) comes in proximity to the sensor element while the powered door is closing, an electrical signal is generated by a central control module. This signal is then sent to another control module controlling the movement of the power lift-gate, causing the control module to stop the closing operation.

Figure 1:
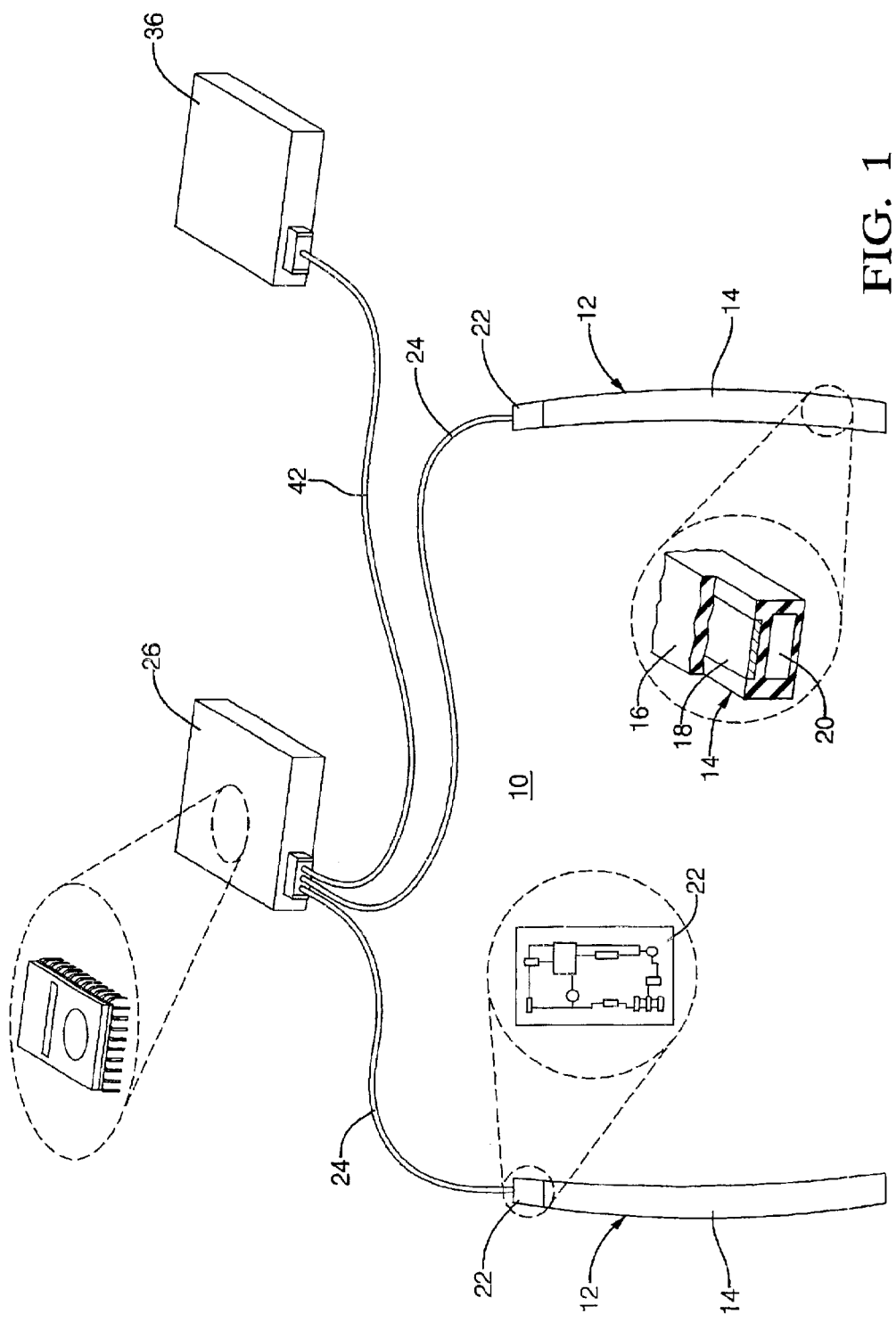
FIG. 1 is a schematic diagram of a non-contact obstacle detection system, in accordance with an embodiment of the invention.

Referring initially to FIG. 1, there is shown a schematic diagram of a non-contact obstacle detection system 10, in accordance with an embodiment of the invention. As stated previously, the non-contact system 10 is based upon ultra sensitive capacitance sensors and capacitance sensing techniques. Accordingly, system 10 includes one or more capacitive sensing elements 12, each configured to have a desired nominal capacitance value. Furthermore, each sensing element 12 is a flexible strip 14 designed to conform to a three-dimensional contoured surface, and to have a relatively low profile so as not to excessively protrude from the surface.

In general, each strip 14 has a flexible, elongated body with an adhesive surface affixed thereto for securing the strip 14 to a metal panel (e.g., a motor vehicle pillar lift-gate). As shown in the insert "A" in FIG. 1, the sensor body may be formed by extruding an insulating, flexible material 16 (such as santoprene rubber) around a flat conductor 18 that serves as one electrode of the capacitive sensing element 12. The conductor 18 is designed to be substantially parallel to the panel along its entire surface when the strip is affixed to the panel. In one embodiment, the conductor 18 serves as one capacitor electrode, while the vehicle body serves as the other electrode. An air cavity 20 within the strip 14 serves, in one aspect, as a dielectric material between the capacitor electrodes. Alternatively, the sensing element 12 may be designed with two conductors molded internally therein. Additional details regarding the capacitive sensing element 12 may be found in following U.S. Patent applications, entitled "Flexible Capacitive Strip for Use in a Non-Contact Obstacle Detection System", entitled "Method and Apparatus for Detecting a Change in Capacitance of a Capacitive Proximity Sensor" and, entitled "Capacitive Sensor Assembly for Use in a Non-Contact Obstacle Detection System", each of which were filed on May 10, 2002, the contents of which are incorporated herein by reference thereto.

Inserted within and coupled to each sensing element 12 is a proximity detection circuit 22, also referred to hereinafter as an ultra sensitive capacitance detector (USCD). The proximity detection circuit 22 (represented symbolically within insert "B" in FIG. 1) senses a change in capacitance of its associated capacitive sensing element 12. In a preferred embodiment, the proximity detection circuit 22 operates by comparing a first frequency generated by a first oscillator to a reference frequency generated by a reference oscillator. The first frequency is dependent upon the capacitance value of the sensing element 12. As the capacitance value of the sensing element 12 changes (for example, due to a foreign object in proximity to the sensing element), so does the first frequency. The reference frequency remains fixed, and a differential output signal is generated which represents the difference in frequencies between the first frequency and the reference frequency. Additional information regarding a specific embodiment and capacitance detection method for the proximity detection circuit may be found in U.S. Patent application, entitled "Method and Apparatus for Detecting a Change in Capacitance of a Capacitive Proximity Sensor", the contents of which is incorporated herein by reference thereto.

A coaxial cable 24 (or, alternatively a twisted pair of conductors) is used to transmit the differential output signal from each proximity detection circuit 22 within a sensing element 12 to a central control module 26. The frequency of the differential output signal may vary from about 3 to about 15 MHz, a relatively low frequency range for RF devices. Accordingly, the effect of radiated signals to any other electronic components in the vicinity of the cable 24 should be reduced. In contrast, the oscillators used in the proximity detection circuit 22 operate at relatively high frequencies (e.g., >900 MHz) and are thus localized and shielded within the circuit 22.

It should be noted at this point that although a preferred frequency range for the oscillators is in the 900 MHz range, the system will work at any operating frequency. One advantage, however to operating above 900 MHz is the increased sensitivity of the circuit 22 to a change in capacitance. In addition, there is already an existing frequency band set by the FCC (between 902 to 928 MHz) for field disturbance sensing devices, which also covers the peak radiated power generated by the devices. Thus, operating the circuit at a different frequency range might result in additional time and costs in obtaining any necessary FCC approval.

A second purpose of the air cavity 20 within the sensing element strip 14, therefore, is to house the proximity detection circuit 22 so as to isolate the relatively high frequency signals generated therein. Further details regarding the integration of the proximity detection circuit 22 with the sensing element 12 are also found in U.S. Patent applications, entitled "Flexible Capacitive Strip for Use in a Non-Contact Obstacle Detection System", entitled "Method and Apparatus for Detecting a Change in Capacitance of a Capacitive Proximity Sensor", entitled "Capacitive Sensor Assembly for Use in a Non-Contact Obstacle Detection System", each of which were filed on May 10, 2002, the contents of which are incorporated herein by reference.

In addition to transmitting the RF output signal, the cable 24 also carries a DC power signal (e.g., 5 volts) from the control module 26 to the corresponding USCD 22, thereby eliminating the need for individual power lines and RF signal lines. In order to send both DC and RF signals through a single line, a bias "T" apparatus is preferably provided for both the proximity detector circuit 22 and the central control module 26. As is known in the art, a bias "T" is generally used to couple a DC voltage onto a line used for AC (RF) signals, or to detect/remove the DC component of a composite signal. In a simple form, a bias "T" may include an inductive choke or, for frequencies exceeding 1 GHz, specifically tuned elements on a circuit board. Additional information on bias "T" arrangements may be found in U.S. Pat. No. 6,229,408 to Jovanovich, et al. the contents of which are incorporated herein by reference thereto. It will be appreciated that, if multiple sensing elements 12 are used in system 10, then the central control module 26 will include a multiple bias "T" arrangement.

Figure 2:
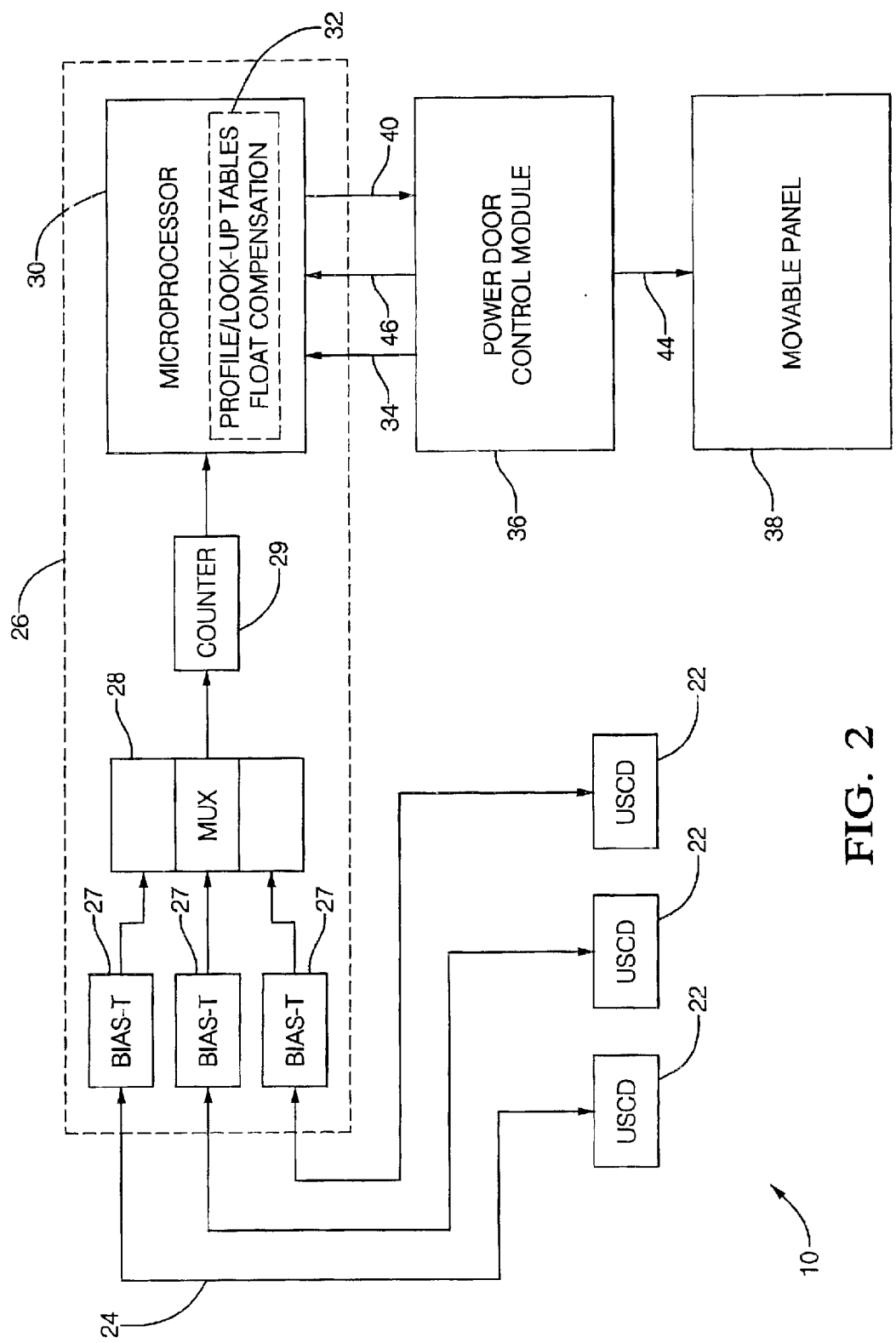
FIG. 2 is a functional block diagram of the non-contact obstacle detection system shown in FIG. 1.

As is seen most particularly in the block diagram of FIG. 2, the central control module 26 receives the differential output signals from each USCD 22. Again, a bias "T" arrangement 27 is provided for each USCD 27, and the input signals are sent through a multiplexer 28 and binary counter 29 to determine the specific frequency of each signal. The frequencies are converted into a digital representation thereof through a binary counter 29. A corresponding code (e.g., a 12-bit code) is thereby generated for use by a microprocessor 30 within the central control module 26. Software within the module 26, represented symbolically within insert "C" in FIG. 1, is then used to compare the frequency value of a given differential output signal (from a particular sensing element 12 and corresponding USCD therein) to a nominal value stored in a profile or lookup table 32 to determine if an obstacle is present.

Alternatively, and if the USCD is a voltage varying device, an analog to digital converter is used to convert the frequencies to a digital representation.

The profile table 32 preferably contains a nominal value for each discrete door position, as may be determined by an optical encoded output signal 34 generated by a power door control module 36. During the closing of a power door or moveable panel 38, it is conceivable, for example, that there could be a slightly increased capacitance detected by one or more proximity detection circuits 22 as a result of the door 38 approaching the sensing element(s) (in an embodiment in which at least one sensing element 12 is affixed to a stationary vehicle pillar). Thus, the system 10 is calibrated to compensate for such an increase, so as to distinguish approaching vehicle hardware from an actual object in proximity to the sensing elements 12.

When implemented in conjunction with a motor vehicle, the profile table 32 may be programmed generically to cover several vehicle designs or specifically for a particular vehicle design. However, the profile table 32 is preferably adapted to be automatically updated through the use of flash RAM or other suitable programmable memory structure. In addition, it is contemplated that system 10 is capable of being used as an obstacle detection system for other non-vehicular applications, for example an automotive door to a building or structure or a garage door.

In the event that a foreign object is in proximity to one or more sensing elements 12 within the obstacle detection system 10 during a door closing operation, the resulting differential output frequency from one or more of the sensing elements 12 will differ from that contained in the appropriate profile table. The microprocessor 30 within the central control module 26 will then send a signal 40 to the power door control module 36 through data line 42 (shown in FIG. 1) which will cause the power door control module 36 to both stop and reverse the closing motion of the door 38 through signal 44.

In addition to sharing position information on the door/panel 38, the power door control module 36 may also be configured to provide an indication when the door 38 is in a fully closed position, through signal 46. Optionally, the central control module 26 could be expanded and integrated with the power door control module 36 to promote part reduction and cost savings. Other features may include a power saving or "sleep" mode in which the central control module 26 switches the power to each individual proximity detection circuit 22 off when the door 38 is in a fully closed position.

The software is further capable of compensating for environmental changes (such as the presence of water on the sensing elements 12), while still accurately detecting the presence of a foreign object, through the use of a floating variable routine. Because changes in temperature, humidity and other atmospheric conditions can have an effect on the system, a "floating variable" is added to the profile table value for each discrete door position. The floating variable will automatically increase or decrease, depending upon the specific environmental conditions or structural changes to the power door. Otherwise, an increase in capacitance of a sensing element 12 due to, for example, the presence of moisture thereon could be interpreted by the system 10 as a foreign object.

FIGS. 3 through 8 are flow diagrams that illustrate exemplary subroutines related to a floating variable algorithm for compensating for environmental and structural changes. Generally speaking, the environmental changes are compensated by a global floating variable having a value that increases or decreases over time as the current capacitance value deviates from a present profile value. The rate of change of the global floating variable is kept relatively slow so that a "fast" environmental change due to human interaction can be detected and distinguished from a true environmental change. Furthermore, the global floating variable applies to all points in the profile table.

On the other hand, the position floating variable includes a specific table of values that correspond to each position in the profile table. Each value is either incremented or decremented as the door moves through a position. If a difference is seen between the present position and the profile position value, then the position float variable is updated. This technique compensates for structural changes in the vehicle, such as door-to-body alignment or strut alignment, which in turn affect a portion of the profile table.

Figure 3:
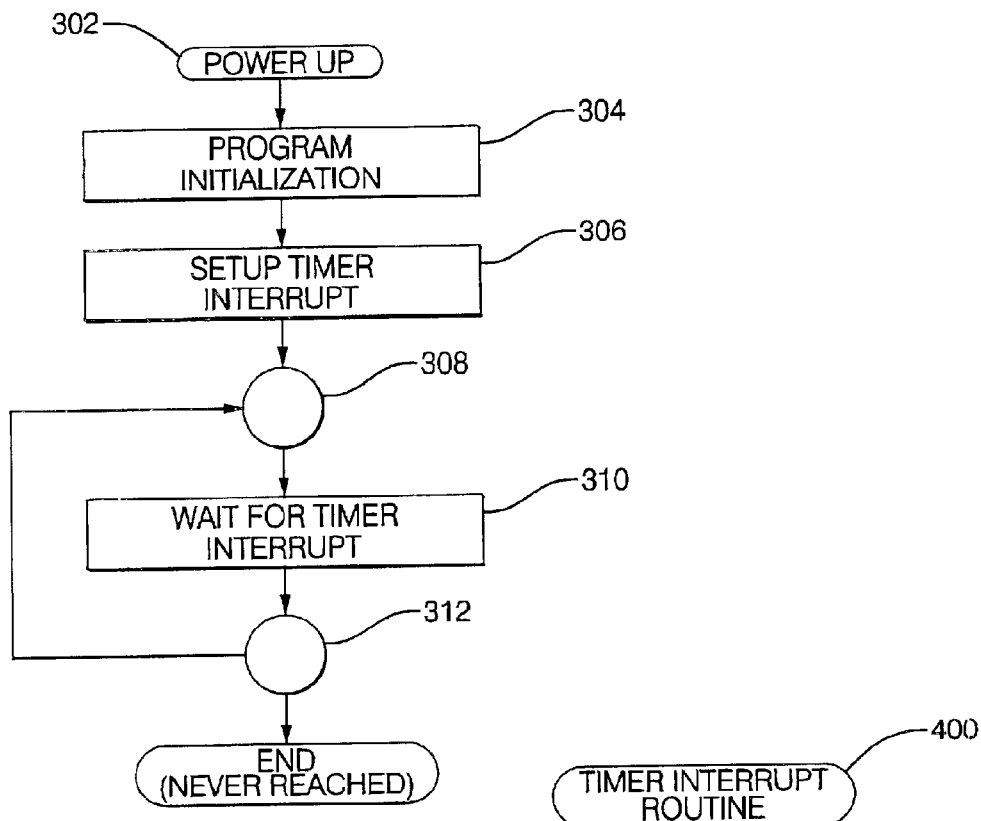
FIGS. 3 through 8 are flow diagrams that illustrate exemplary subroutines related to a floating variable algorithm for compensating for environmental and structural changes.

In FIG. 3, there is shown a general routine implemented during the software system power up (block 302) and initialization steps (block 304). At block 306, a timer interrupt routine is set up. The timer interrupt routine, (indicated at node 308) is designed to begin the process of gathering input reading from one or more capacitive sensors, processing the gathered data, and updating the global and position float variables as necessary when the vehicle lift gate is being closed. By way of example, the timer interrupt duration is set for about 500 microseconds ($\mu$s). After waiting for the timer interrupt routine to be completed at block 310 and node 312, the process is sent back to node 308 for continuous repetition of the routine. Of course, and as applications may require, the timer interrupt duration can be greater or less than 500 microseconds.

Figure 4:
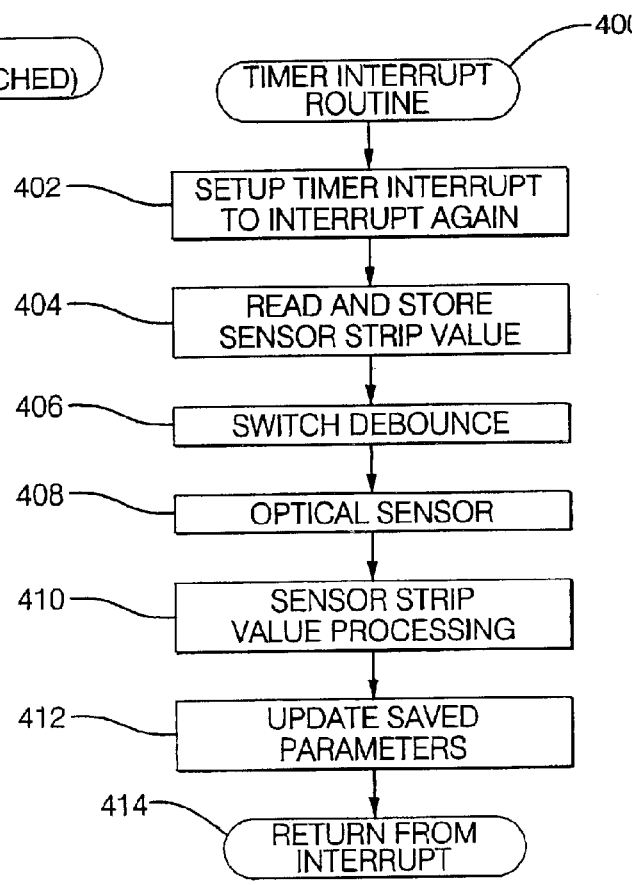

FIG. 4 is another flow diagram that more specifically illustrates the steps implemented in the timer interrupt routine 400. At block 402, the Setup Timer Interrupt starts another data sample cycle, which will be used, in the next program cycle. The capacitive sensor strip values are then read and stored as shown at block 404. In addition, the lift gate position is continuously monitored as reflected in blocks 406 (providing switch debouncing for the lift gate latch) and 408 (optical position sensing). At block 410, the sensor strip values that were read and stored in block 404 are then processed as is described in greater detail in FIGS. 5 through 8. Any saved parameters such as global float variable or position float variables are stored in block 412 and the process return from the interrupt at block 414.

Figure 5:
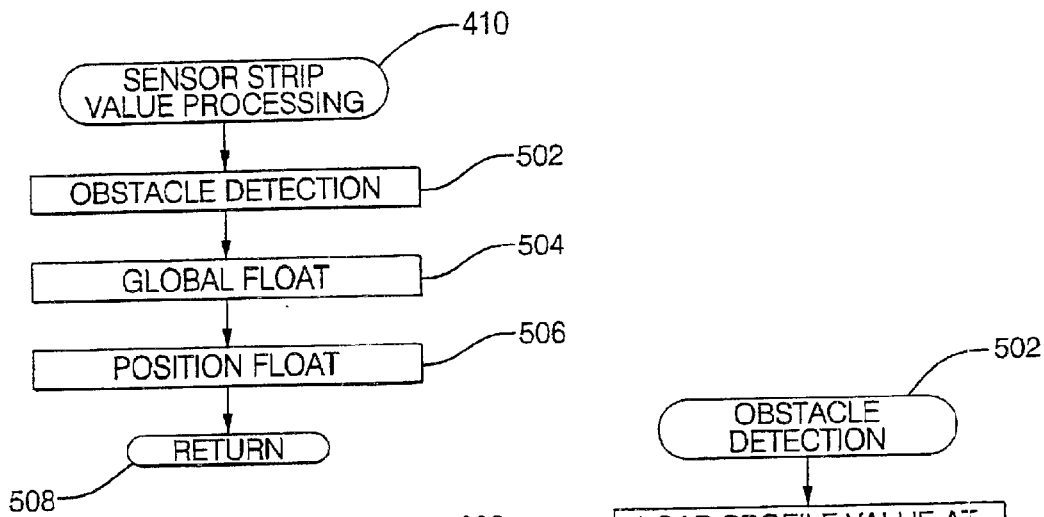

Referring now to FIG. 5, the flow diagram therein generally illustrates the three general steps involved the sensor strip value processing block 410 in FIG. 4. First, an obstacle detection routine is run at 502, and is described in further detail in FIG. 6. Thereafter, a global float routine is run at block 504, and is described in further detail in FIG. 7. Following the global float routine, a position float routine is run at block 506 (described in further detail in FIG. 8) before returning back to block 412 in FIG. 4.

Figure 6:
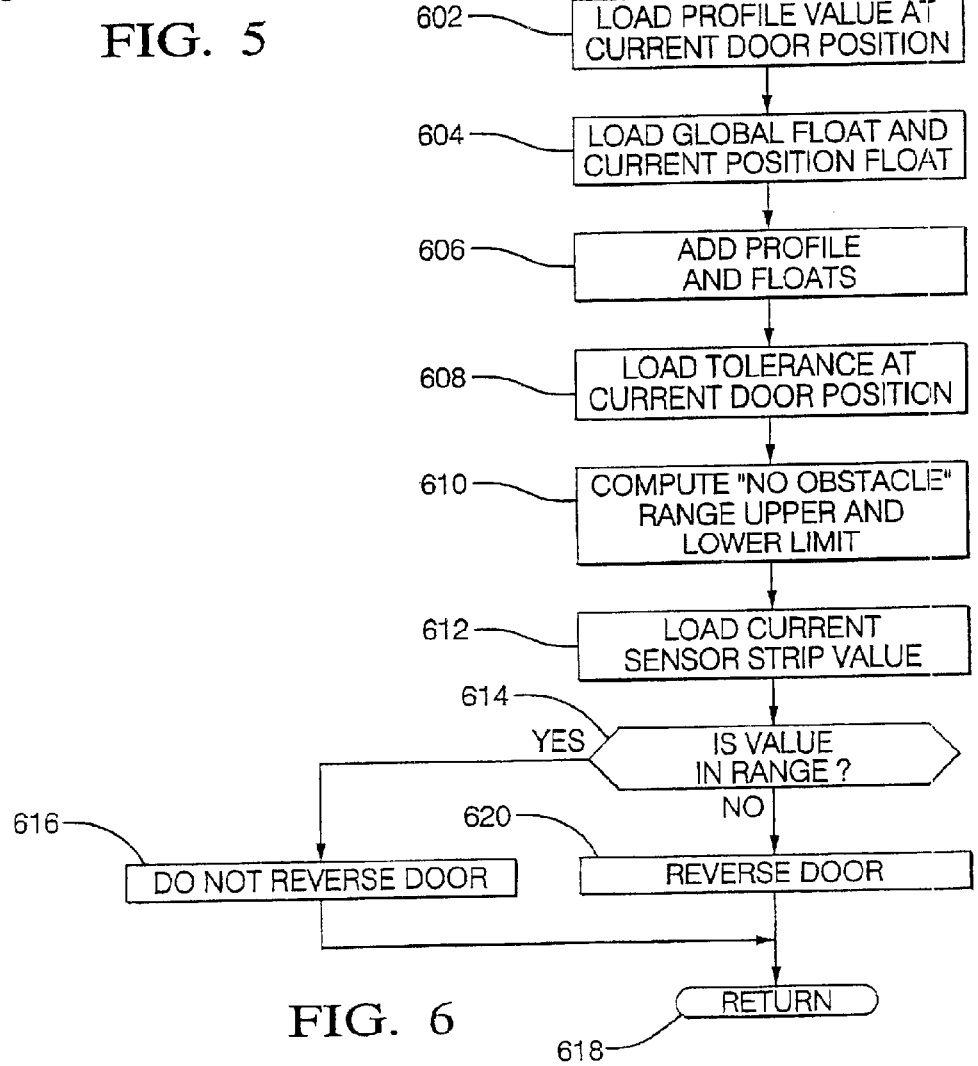
Figure 7:
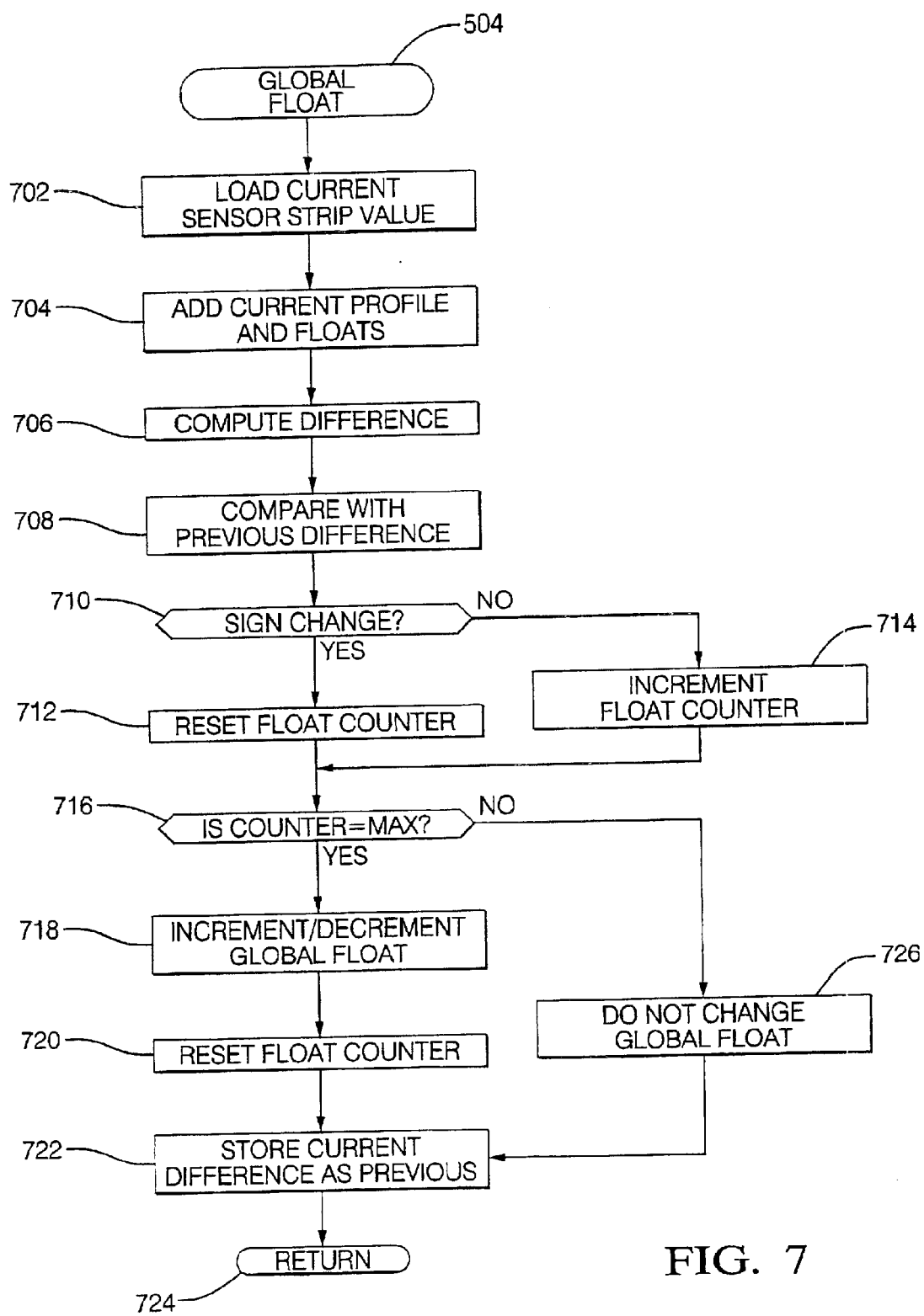

Referring now to FIG. 6, there is shown a more detailed flow diagram for the obstacle detection routine 502. Initially, at block 602, a profile value is loaded for the current door position occupied by the lift gate at that moment in time. The profile value is reflective of the digitized capacitance value that would signify no obstacle being present at that specific door position. Along with the profile value, the current global and position floats (as determined from those particular subroutines) are also loaded at block 604. At, block 606, the profile value is then added to the float values to result in an adjusted profile value that takes the floats into account. Then, a tolerance for the particular door position is loaded at block 608. The specific tolerance is door position dependent, and will help to establish a range of values for which it will be determined that no obstacle is present. This range is determined at block 610, where upper and lower limit values are computed for a "no obstacle" range.

Proceeding to block 612, the current sensor strip value is loaded for comparison to the upper and lower limits established in block 610. If the current value is within the range as determined at decision block 614, then no obstacle is deemed present, and no corrective action is taken with respect to the lift gate (i.e., the door is not reversed, as shown in block 616). The process returns to FIG. 5, as shown at block 618. However, if the current value is not within the range as determined at decision block 614, then an obstacle is deemed present. A corrective action, for example a door reversal, is then commanded at block 620.

Again, after the obstacle detection routine 502 is executed as described above, a global float routine 504 is implemented. This is shown in the flow diagram of FIG. 7. Global float routine 504 begins at block 702, where the current sensor strip value is loaded. Then, the current profile is added to the previously stored global and positional floats at block 704. A difference is then computed between the sum determined in block 704 and a reference value. At block 708, this difference is then compared with a previous difference determined from the preceding iteration of the global float routine 502. If at decision block 710 a sign change is determined, then a float counter is reset, as shown at block 712. If not, the float counter in incremented as shown at block 714.

Regardless of whether the float counter is incremented or reset, an inquiry is made at decision block 716 as to whether the float counter has reached a preset maximum value. If so, the routine proceeds to block 718 where the global float is either incremented or decremented, depending upon the conditions present. The float counter is then reset at block 720, and the current difference computed in block 706 is stored to be used as the "previous difference" value (block 708) for the next iteration. Alternatively, if at decision block 716, the counter has not reached the preset maximum value, the global float is not changed. This allows a slower transition of the global float value to adapt to environmental conditions, as described above. Even if the global float value is not changed the current difference is still stored at block 722, and the routine returns to FIG. 5, as shown in block 724.

Figure 8:
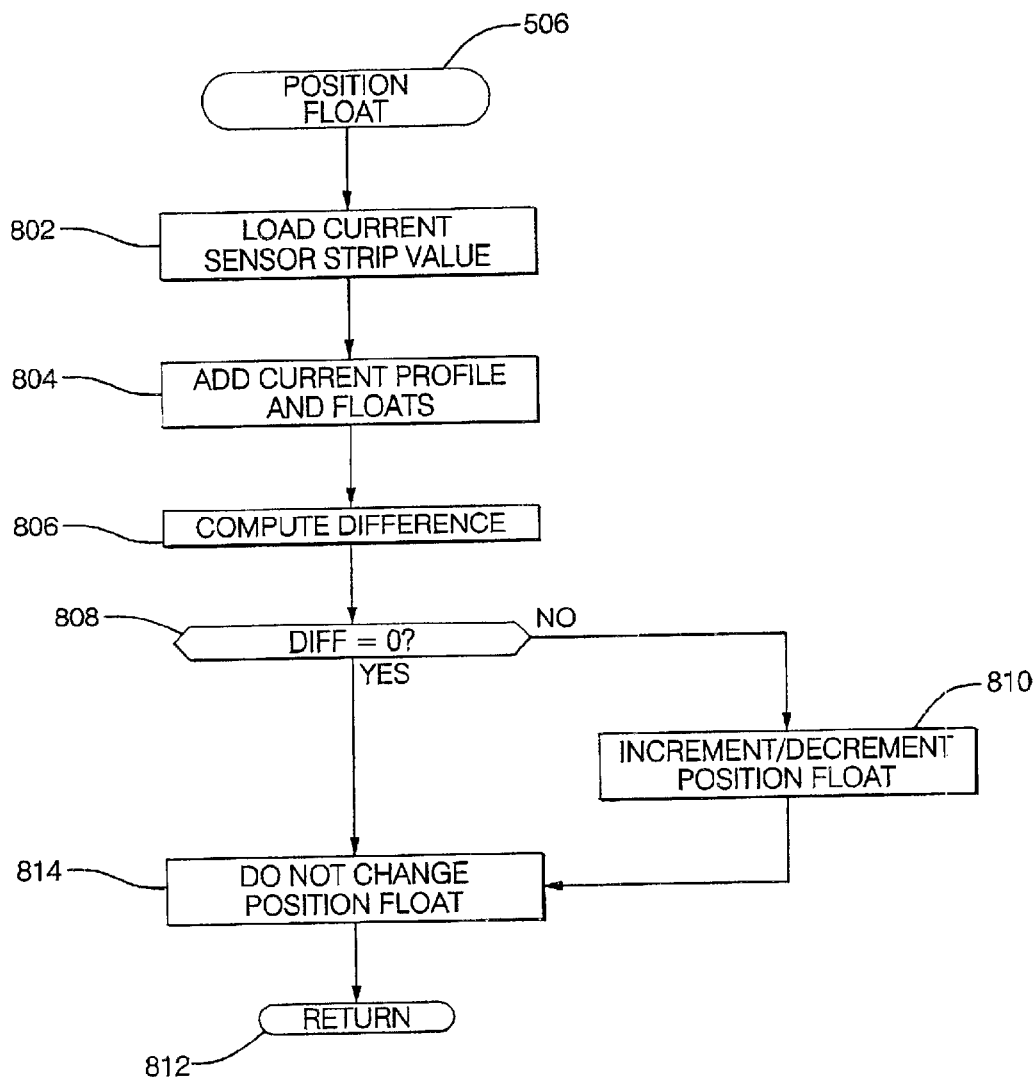

Finally, the position float routine 506 is illustrated in further detail in FIG. 8. As any change in position float relates to the position of the door, the routine 506 is only run when a change in door position occurs. The current sensor strip value is loaded at block 802 and then added with the current profile and previous position float at block 804. It will be noted that the global float is not considered in this subroutine. Similar to the global float subroutine, the position float routine 502 then computes, at block 806, a difference between the sum determined in block 804 and a reference value from the preceding iteration of the routine. If a difference exists, then the position float is immediately changed (incremented or decremented) as reflected in block 810 before returning to FIG. 5. If no difference exists, then the position float is not changed (block 814). However, in contrast to the global float routine, there is no position float counter.

It will be appreciated from the above described embodiments that the system 10 provides a means to detect the presence of an obstacle (such a human) in proximity a moving powered door, notwithstanding changes to the environment in which the sensing elements 12 are located. While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An obstacle detection system comprising:
   a sensing element disposed in proximity to a moveable panel;
   a proximity detection circuit in communication with said sensing element, said proximity detection circuit generating a differential output signal reflective of whether a foreign object is in proximity to said element;
   a central control module in communication with said sensing element, said central control module determining whether said differential output signal is reflective of a foreign object in proximity to said sensing element, wherein, if said central control module determines that said differential output signal is reflective of a foreign object in proximity to said sensing element, and said moveable panel is moving toward a closed position, then said central control module generates a control output signal to stop said moveable panel from moving toward said closed position;
   a first oscillator which generates a first frequency signal, said first frequency signal dependent upon the capacitance of said sensing elements; and
   a second oscillator which generates a reference frequency signal, wherein said differential output signal is determined from a comparison between said first frequency signal and said reference frequency signal.

2. The obstacle detection system of claim 1, wherein said sensing element further comprises a capacitive sensing element having a nominal capacitance.

3. The obstacle detection system of claim 2, wherein said proximity detection circuit detects a change in said nominal capacitance as a result of a foreign object in proximity to said sensing element.

4. The obstacle detection system of claim 3, wherein said proximity detection circuit is integrated within said sensing element.

5. The obstacle detection system of claim 1, further comprising:
   a coaxial cable coupling said proximity detection circuit and said central control module, said coaxial cable transmitting both a DC power signal and said differential output signal.

6. The obstacle detection system of claim 5, wherein both said proximity detection circuit and said central control module further comprises a bias "T" apparatus included therewith.

7. The obstacle detection system of claim 5, wherein said differential output signal has a frequency range of about 0 HZ to about 15 MHz.

8. The obstacle detection system of claim 5, wherein said first frequency signal and said reference frequency signal are generated at a frequency of at least 900 MHz.

9. The obstacle detection system of claim 1, wherein said central control module further comprises:
  a microprocessor; and
  software for comparing said differential output signal to a nominal value, said nominal value depending upon a specific position of said moveable panel.

10. An obstacle detection system comprising:
  at least one sensing element disposed in proximity to a moveable panel;
  a proximity detection circuit in communication with each said at least one sensing element, each said proximity detection circuit generating a differential output signal reflective of whether a foreign object is in proximity to said at least one sensing element corresponding thereto;
  a central control module in communication with each said sensing element, said central control module determining whether each said differential output signal is reflective of a foreign object in proximity to said at least one sensing element, wherein, if said central control module determines that said differential output signal is reflective of a foreign object in proximity to said at least one sensing element, and said movable panel is moving toward a closed position, then said central control module generates a control output signal to stop said moveable panel from moving toward said closed position;
  a first oscillator which generates a first frequency signal, said first frequency signal dependent upon the capacitance of said at least one sensing element corresponding thereto; and
  a second oscillator which generates a reference frequency signal, wherein said differential output signal is determined from a comparison between said first frequency signal and said reference frequency signal.

11. The obstacle detection system of claim 10, wherein each said at least one sensing element further comprises a capacitive sensing element having a nominal capacitance.

12. The obstacle detection system of claim 11, wherein each said proximity detection circuit detects a change in said nominal capacitance as a result of a foreign object in proximity to said at least one sensing element corresponding thereto.

13. The obstacle detection system of claim 12, wherein each said proximity detection circuit is integrated within said at least one sensing element corresponding thereto.

14. The obstacle detection system of claim 10, further comprising:
  a coaxial cable coupling each said proximity detection circuit with said central control module, each said coaxial cable transmitting both a DC power signal and said differential output signal.

15. The obstacle detection system of claim 14, wherein each said proximity detection circuit and said central control module further comprises a bias "T" apparatus included therewith.

16. The obstacle detection system of claim 14, wherein each said
  said differential output signal has a frequency range of about 0 Hz to about 15 MHz; and
  said first frequency signal and said reference frequency signal are generated at a frequency of at least 900 MHz.

17. The obstacle detection system of claim 10, wherein said central control module further comprises:
  a microprocessor;
  a multiplexer for selectively passing a selected differential output signal from each differential output signal inputted to said multiplexer; and
  software for comparing said selected differential output signal to a nominal value, said nominal value depending upon a specific position of said moveable panel.

18. The obstacle detection system of claim 10, further comprising:
  a power door control module in communication with said central control module, said power door control module controlling the movement of said moveable panel.

19. An obstacle detection system for a vehicle comprising:
  a moveable panel;
  a sensing element disposed in proximity to said moveable panel;
  a proximity detection circuit in communication with said sensing element, said proximity detection circuit generating a differential output signal reflective of whether a foreign object is in proximity to said sensing element;
  a central control module in communication with said sensing element, said central control module determining whether said differential output signal is reflective of a foreign object in proximity to said sensing element, wherein, if said central control module determines that said differential output signal is reflective of a foreign object in proximity to said sensing element and said moveable panel is moving toward a closed position, then said central control module generates a control output signal to stop said moveable panel from moving toward said closed position;
  a first oscillator which generates a first frequency signal, said first frequency signal dependent upon the capacitance of said sensing element; and
  a second oscillator which generates a reference frequency signal, wherein said differential output signal is determined from a comparison between said first frequency signal and said reference frequency signal.

20. The obstacle detection system of claim 19, wherein said sensing element further comprises a capacitive sensing element having a nominal capacitance.

21. The obstacle detection system of claim 20, wherein said proximity detection circuit detects a change in said nominal capacitance as a result of a foreign object in proximity to said element.

22. The obstacle detection system of claim 21, wherein said proximity detection circuit is integrated within said sensing element.

23. The obstacle detection system of claim 19, further comprising:
  a coaxial cable coupling said proximity detection circuit and said central control module, said coaxial cable transmitting both DC power signal and said differential output signal.

24. The obstacle detection system of claim 23, wherein both said proximity detection circuit and said central control module further comprises a bias "T" apparatus included therewith.

25. The obstacle detection system of claim 23, wherein said differential output signal has a frequency range of about 0 Hz to about 15 MHz.

26. The obstacle detection system of claim 23, wherein said first frequency signal and said reference frequency signal are generated at a frequency of at least 900 MHz.

27. The obstacle detection system of claim 19, wherein said central control module further comprises:
  a microprocessor; and
  software for comparing said differential output signal to a nominal value, said nominal value depending upon a specific position of said moveable panel.

28. The obstacle detection system of claim 27, wherein said software further includes a floating variable routine for compensating for environmental changes and structural changes proximate said moveable panel.

29. The obstacle detection system of claim 28, wherein said floating variable further comprises a global float routine and a position float routine, said global float routine further comprises a global float routine and a position float routine, said global float routine being responsive to environmental changes and said position float routine being responsive to positional change of said moveable panel.

30. The obstacle detection system of claim 29, wherein said global float routine further includes a global float counter, said global float counter preventing a change in a given global value until such time as said global float counter has reached a determined value.

* * * * *